United States Patent
Ali et al.

(10) Patent No.: US 10,224,053 B2
(45) Date of Patent: Mar. 5, 2019

(54) AUDIO SIGNAL QUALITY ENHANCEMENT BASED ON QUANTITATIVE SNR ANALYSIS AND ADAPTIVE WIENER FILTERING

(71) Applicants: Hyundai Motor Company, Seoul (KR); Kia Motors Corporation, Seoul (KR)

(72) Inventors: Mahdi Ali, Detroit, MI (US); Xuan Zhou, Shanghai (CN); Rakan Chabaan, Farmington Hills, MI (US); Nabih Jaber, Southfield, MI (US); Meihui Lu, Shanghai (CN); Kun Hua, Southfield, MI (US)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/468,779

(22) Filed: Mar. 24, 2017

(65) Prior Publication Data

US 2018/0277135 A1    Sep. 27, 2018

(51) Int. Cl.
*H04R 3/04* (2006.01)
*G01R 29/26* (2006.01)
*G10L 21/02* (2013.01)
*G10L 25/03* (2013.01)
*G10L 25/06* (2013.01)

(Continued)

(52) U.S. Cl.
CPC .......... *G10L 21/0208* (2013.01); *G01R 29/26* (2013.01); *G10L 21/0205* (2013.01); *G10L 21/0216* (2013.01); *G10L 21/0232* (2013.01); *G10L 25/51* (2013.01); *H04R 3/04* (2013.01); *G10L 25/03* (2013.01); *G10L 25/06* (2013.01); *G10L 25/84* (2013.01)

(58) Field of Classification Search
None
See application file for complete search history.

(56) References Cited

U.S. PATENT DOCUMENTS 4,542,525 A * 9/1985 Hopf ................. G10H 1/00
381/110
5,963,901 A * 10/1999 Vahatalo ........... G10L 21/0208
704/218

(Continued)

FOREIGN PATENT DOCUMENTS

CN          103745729 A     4/2014

*Primary Examiner* — Fariba Sirjani
(74) *Attorney, Agent, or Firm* — Mintz Levin Cohn Ferris Glovsky and Popeo, P.C.; Pater F. Corless

(57) ABSTRACT

An audio signal enhancement method includes: acquiring an audio signal; estimating a signal-to-noise ratio (SNR) of an audio frame of the audio signal; determining a SNR threshold for the audio frame; selecting an audio signal processing technique according to a comparison of the SNR threshold to the estimated SNR of the audio frame; filtering the audio frame using a Wiener filter applying the selected signal processing technique; and outputting the audio frame filtered using the Wiener filter applying the selected signal processing technique. A first-in, first-out (FIFO) signal processing technique is selected when the estimated SNR of the audio frame is less than the SNR threshold, and a log-energy voice activity detection (VAD) signal processing technique is selected when the estimated SNR of the audio frame is greater than the SNR threshold.

18 Claims, 3 Drawing Sheets

(51) Int. Cl.
   *G10L 25/51*      (2013.01)
   *G10L 25/84*      (2013.01)
   *G10L 21/0208*    (2013.01)
   *G10L 21/0216*    (2013.01)
   *G10L 21/0232*    (2013.01)

(56) References Cited

U.S. PATENT DOCUMENTS

| | | | | |
|---|---|---|---|---|
| 6,094,726 A * | 7/2000 | Gonion | ............... | G06F 15/8046 712/221 |
| 6,898,566 B1 * | 5/2005 | Benyassine | ............ | G10L 19/22 704/207 |
| 7,889,874 B1 * | 2/2011 | Ayad | ....................... | G10K 11/00 381/94.1 |
| 2005/0119886 A1 * | 6/2005 | Walker | .................... | G10L 15/02 704/231 |
| 2006/0253283 A1 * | 11/2006 | Jabloun | .................. | G10L 25/78 704/233 |
| 2008/0228478 A1 * | 9/2008 | Hetherington | .......... | G10L 25/87 704/233 |
| 2009/0085873 A1 * | 4/2009 | Betts | ................... | G08B 13/1427 345/169 |
| 2009/0220107 A1 * | 9/2009 | Every | ................. | G10L 21/0208 381/94.7 |
| 2009/0254340 A1 * | 10/2009 | Sun | ..................... | G10L 21/0208 704/226 |
| 2010/0094625 A1 * | 4/2010 | Mohammad | ............ | G10L 25/48 704/233 |
| 2011/0142256 A1 * | 6/2011 | Lee | ..................... | G10L 21/0208 381/94.3 |
| 2011/0257967 A1 * | 10/2011 | Every | ................. | G10L 21/0208 704/226 |
| 2011/0264447 A1 * | 10/2011 | Visser | .................... | G10L 25/78 704/208 |
| 2014/0337021 A1 * | 11/2014 | Kim | .................... | G10L 21/0208 704/228 |
| 2014/0376743 A1 * | 12/2014 | Hetherington | ........... | H03G 3/20 381/94.2 |
| 2015/0249664 A1 * | 9/2015 | Talhami | .................. | G06F 21/32 726/6 |
| 2016/0232915 A1 * | 8/2016 | Lepauloux | .......... | G10L 21/0208 |
| 2016/0350987 A1 * | 12/2016 | Zivkovic | ............ | G07C 9/00007 |

* cited by examiner

AUDIO SIGNAL QUALITY ENHANCEMENT BASED ON QUANTITATIVE SNR ANALYSIS AND ADAPTIVE WIENER FILTERING

TECHNICAL FIELD

The present disclosure relates generally to audio signal quality enhancement techniques, and more particularly, to audio signal quality enhancement based on quantitative signal-to-noise ratio (SNR) analysis and adaptive Wiener filtering.

BACKGROUND

Voice recognition-enabled applications have become increasingly common in modern vehicles. Such technology allows for the driver of a vehicle to perform in-vehicle functions typically requiring the use of hands, such as making a telephone call or selecting music to play, by simply uttering a series of voice commands. This way, the driver's hands can remain on the steering wheel and the driver's gaze can remain directed on the road ahead, thereby reducing the risk of accidents.

"Hands-free" communication in vehicles is commonly implemented using Bluetooth, which is a short range wireless communication that operates in the Industrial Scientific and Medical (ISM) band at 2.4 to 2.485 GHz. Bluetooth is designed for low-power consumption and replaces standard wire-based communications using low-cost transceiver microchips equipped in each compatible device. Among other things, Bluetooth allows drivers to pair their mobile phones with the vehicles' audio system and establish hands-free calls utilizing the vehicles' audio system.

Voice recognition, or speech recognition, applications can utilize Bluetooth to acquire a speech signal, recognize spoken language within the signal, and translate the spoken language into text or some other form which allows a computer to act on recognized commands. Various models and techniques for performing voice recognition exist, such as the Autoregressive (AR) model, hidden Markov models, dynamic time warping, and neural networks, among others. There are various advantages to each voice recognition model, including greater computational efficiency, increased accuracy, improved speed, and so forth.

Common to all voice recognition approaches is the process of acquiring speech signals from a user. When voice recognition is attempted in a noisy environment, however, performance often suffers due to environmental noises muddying the speech signals from the user. Such problems arise when performing voice recognition in a vehicle, as several sources of noise exist due to vehicular dynamics inside of the vehicle (e.g., the engine, radio, turn signal indicator, window/sunroof adjustments, heating, ventilation, and air conditioning (HVAC) fan, etc.) as well as outside of the vehicle (e.g., wind, rain, passing vehicles, road features such as pot holes, speed bumps, etc.). As a result, the cabin of the vehicle often contains a mixture of different noises, each with different characteristics (e.g., position, direction, pitch, volume, duration, etc.). The result is degraded audio quality in hands-free Bluetooth-based conversations and poor voice recognition accuracy.

SUMMARY

The present disclosure provides techniques for enhancing audio signal quality and, more particularly, noise reduction for voice communication over Bluetooth. Two different noise estimation techniques, log-energy voice activity detection (VAD) and first-in, first-out (FIFO), are employed in conjunction with Wiener filtering. Both noise estimation techniques have advantages under different noisy conditions. Particularly, it has been observed, based on the performance of these techniques, that log-energy VAD is more effective at higher signal-to-noise ratios (SNR) than FIFO, whereas FIFO is more effective at lower SNR than log-energy VAD. Thus, the present disclosure describes an optimized, adaptive approach to noise reduction that combines log-energy VAD and FIFO techniques with Wiener filtering. The result is a new signal filtering algorithm which improves upon conventional Wiener filtering.

According to embodiments of the present disclosure, an audio signal enhancement method includes: acquiring an audio signal; estimating a signal-to-noise ratio (SNR) of an audio frame of the audio signal; determining a SNR threshold for the audio frame; selecting an audio signal processing technique according to a comparison of the SNR threshold to the estimated SNR of the audio frame; filtering the audio frame using a Wiener filter applying the selected signal processing technique; and outputting the audio frame filtered using the Wiener filter applying the selected signal processing technique. A first-in, first-out (FIFO) signal processing technique is selected when the estimated SNR of the audio frame is less than the SNR threshold, and a log-energy voice activity detection (VAD) signal processing technique is selected when the estimated SNR of the audio frame is greater than the SNR threshold.

Correlation coefficients of the FIFO signal processing technique and the log-energy VAD signal processing technique can measure a correlation between a clean signal and respective output signals of the FIFO signal processing technique and the log-energy VAD signal processing technique. In this regard, the audio signal enhancement method may further include calculating the correlation coefficients of the FIFO signal processing technique and the log-energy VAD signal processing technique, respectively. Also, the SNR threshold is a SNR value at which the correlation coefficients of the FIFO signal processing technique and the log-energy VAD signal processing technique, respectively, are the same.

The determining of the SNR threshold may include: estimating a noise level in an environment in which the audio signal was acquired; and determining the SNR threshold based on the estimated noise level. The estimating of the noise level may include estimating the noise level using the FIFO signal processing technique. The estimating of the noise level may also include: determining one or more environmental conditions present when the audio signal is acquired; and estimating the noise level based on the one or more environmental conditions. The one or more environmental conditions may include one or more of a vehicle speed, a fan speed, a weather condition, whether a vehicle window is open, revolutions per minute (RPM) of an engine, and a volume of media being played.

The audio signal enhancement method may further include referencing a look-up table to determine the SNR threshold based on the estimated noise level. The audio signal enhancement method may even further include: measuring SNR thresholds across a plurality of noise levels; and generating the look-up table using the measured SNR thresholds across the plurality of noise levels.

The SNR threshold may vary according to a noise level in an environment in which the audio signal was acquired.

The estimating of the SNR may include estimating the SNR of the audio frame using the FIFO signal processing technique.

Additionally, the audio signal enhancement method may further include dividing the acquired audio signal into a plurality of audio frames, where the audio frame is one of the plurality of audio frames. In this regard, the steps of estimating the SNR, determining the SNR threshold, selecting the audio signal processing technique, filtering the audio frame using the Wiener filter applying the selected signal processing technique, and outputting the audio frame using the Wiener filter applying the selected signal processing technique can be performed for each of the plurality of audio frames.

Also, the acquired audio signal may include a combination of noise and speech. The outputted filtered audio frame may include speech from which noise present in the audio frame is removed.

The audio signal enhancement method may further include converting the audio frame into a frequency domain using a fast Fourier transform (FFT) before the filtering of the audio frame.

In addition, the audio signal may be acquired via Bluetooth, and the audio signal may be acquired in a vehicle.

Furthermore, according to embodiments of the present disclosure, an audio signal enhancement apparatus includes: an audio acquisition unit acquiring an audio signal in a vehicle; and a control unit equipped in the vehicle configured to: estimate a signal-to-noise ratio (SNR) of an audio frame of the audio signal; determine a SNR threshold for the audio frame; select an audio signal processing technique according to a comparison of the SNR threshold to the estimated SNR of the audio frame; filter the audio frame using a Wiener filter applying the selected signal processing technique; and output the audio frame filtered using the Wiener filter applying the selected signal processing technique. A first-in, first-out (FIFO) signal processing technique is selected when the estimated SNR of the audio frame is less than the SNR threshold, and a log-energy voice activity detection (VAD) signal processing technique is selected when the estimated SNR of the audio frame is greater than the SNR threshold.

Furthermore, according to embodiments of the present disclosure, a non-transitory computer readable medium containing program instructions for performing an audio signal enhancement method includes: program instructions that estimate a signal-to-noise ratio (SNR) of an audio frame of an acquired audio signal; program instructions that determine a SNR threshold for the audio frame; program instructions that select an audio signal processing technique according to a comparison of the SNR threshold to the estimated SNR of the audio frame; program instructions that filter the audio frame using a Wiener filter applying the selected signal processing technique; and program instructions that output the audio frame filtered using the Wiener filter applying the selected signal processing technique. A first-in, first-out (FIFO) signal processing technique is selected when the estimated SNR of the audio frame is less than the SNR threshold, and a log-energy voice activity detection (VAD) signal processing technique is selected when the estimated SNR of the audio frame is greater than the SNR threshold.

BRIEF DESCRIPTION OF THE DRAWINGS

The embodiments herein may be better understood by referring to the following description in conjunction with the accompanying drawings in which like reference numerals indicate identically or functionally similar elements, of which.

Figure 1A:
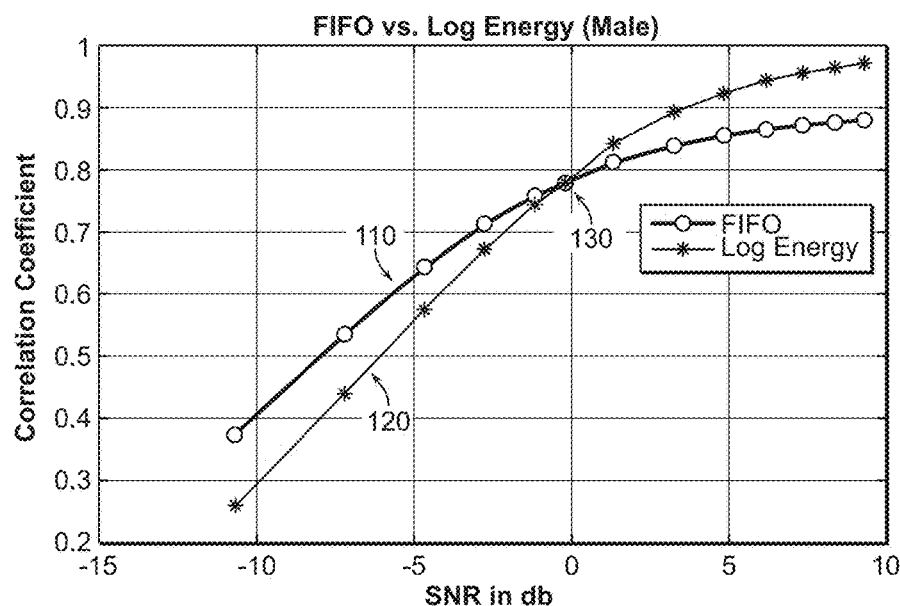
FIGS. 1A and 1B are graphs illustrating a performance comparison of FIFO and log-energy VAD signal processing techniques with different speech types.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles, in general, such as passenger automobiles including sports utility vehicles (SUV), buses, trucks, various commercial vehicles, watercraft including a variety of boats and ships, aircraft, and the like, and includes hybrid vehicles, electric vehicles, hybrid electric vehicles, hydrogen-powered vehicles and other alternative fuel vehicles (e.g., fuels derived from resources other than petroleum). As referred to herein, a wireless charging-capable vehicle includes any vehicle which is operable to be wirelessly charged, such as an electric vehicle (EV), hybrid electric vehicle (HEV), and the like. An EV is a vehicle that includes, as part of its locomotion capabilities, electrical power derived from a chargeable energy storage device (e.g., one or more rechargeable electrochemical cells or other type of battery). An EV is not limited to an automobile and may include motorcycles, carts, scooters, and the like. Furthermore, an HEV is a vehicle that has two or more sources of power, for example both gasoline-based power and electric-based power.

Additionally, it is understood that one or more of the below methods, or aspects thereof, may be executed by at least one control unit. The control unit may be implemented in a vehicle, as described herein. The term "control unit" may refer to a hardware device that includes a memory and a processor. The memory is configured to store program instructions, and the processor is specifically programmed to execute the program instructions to perform one or more processes which are described further below. Moreover, it is understood that the below methods may be executed by a system comprising the control unit in conjunction with one or more additional components, as described in detail below.

Furthermore, the control unit of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Referring now to embodiments of the present disclosure, techniques described herein utilize an optimized, adaptive approach to noise reduction that combines log-energy VAD and FIFO noise estimation techniques with Wiener filtering to enhance audio signal quality and, more particularly, reduce noise in voice communication over Bluetooth. Both noise estimation techniques have advantages under different noisy conditions. Particularly, it has been observed, based on the performance of these techniques, that log-energy VAD is more effective at higher signal-to-noise ratios (SNR) than FIFO, whereas FIFO is more effective at lower SNR than log-energy VAD. Combining the log-energy VAD and FIFO noise estimation techniques improves Wiener filtering performance, allowing for greater sensitivity and accuracy in speech recognition. The result is a new signal filtering algorithm which improves upon conventional Wiener filtering.

I. Wiener Filtering Algorithm

The Wiener filter is a popular algorithm that is employed in many signal enhancement methods. The basic principle of the Wiener filter algorithm involves computing a statistical estimate of an unknown signal using a related signal as input and filtering the known signal in order to output the estimated signal. In the area of speech recognition, in particular, the Wiener filter attempts to obtain a clean signal from a speech signal corrupted with additive noise by filtering out noise from the corrupted signal to provide a noise-less (or noise-reduced) estimate of the underlying speech signal. To this end, Wiener filtering computes a statistical estimate of an unknown signal from a related signal. Such estimation is obtained by minimizing the mean square error (MSE) between a desired clean speech signal s(n) and an estimated signal ŝ(n).

To obtain a clean signal s(n), information pertaining to additive noise must be provided. In speech enhancement applications, the input signal is a combination of clean speech and noise as follows:

$$y(n)=s(n)+n(n) \quad \text{[Equation 1]},$$

where s(n) is the clean speech signal, n(n) is the noise signal, and y(n) is the input signal.

The signals are transferred into the frequency domain using the below equation:

$$Y(\omega)=S(\omega)+N(\omega) \quad \text{[Equation 2]}.$$

The power spectral density (PSD) of the input signal and noise signal is then calculated as follows:

$$P_y(\omega)=|Y(\omega)|^2/T \quad \text{[Equation 3]},$$

where T is the time range of the signal. The PSD of the clean signal and noise signal can be calculated in the same manner using Equation 3.

Meanwhile, Equation 1 can be rewritten as follows, based on the assumption that the clean speech signal and noise signal are uncorrelated:

$$P_y(\omega)=P_s(\omega)+P_n(\omega) \quad \text{[Equation 4]}.$$

The Wiener filter transfer function for the estimated signal $\hat{S}(\omega)$ of clean speech signal $S(\omega)$ is formed as shown in Equations 5 and 6 below:

$$\hat{S}(\omega) = W(\omega)Y(\omega), \text{ and} \quad \text{[Equation 5]}$$

$$W(\omega) = \frac{S(\omega)}{Y(\omega)} = \frac{P_s(\omega)}{P_s(\omega) + P_n(\omega)}. \quad \text{[Equation 6]}$$

By considering the signal s and noise n as uncorrelated signals, the signal-to-noise ratio (SNR) can be derived as follows:

$$SNR = \frac{P_s(\omega)}{P_n(\omega)}. \quad \text{[Equation 7]}$$

By integrating Equations 6 and 7, the Wiener filter transfer function can be derived as follows:

$$W(\omega) = \left[1 + \frac{1}{SNR}\right]^{-1}. \quad \text{[Equation 8]}$$

Finally, transformation back to the time domain from the frequency domain output signal found in Equation 5 is performed.

A. Decision-Directed Approach Wiener Filter

The traditional Wiener filter has been recently improved upon by the Decision-Directed (DD) approach Wiener filter. In the DD method, a posteriori SNR and a priori SNR are computed instead of the regular SNR shown in Equation 7. The a posteriori and a priori SNR estimations enhance the speech enhancement system and help reduce the musical tone. A posteriori SNR is directly obtained from the input signal, and the DD approach will estimate a priori SNR.

A posteriori SNR is estimated as follows:

$$S\hat{N}R_{post}^t(\omega) = \frac{P_y(\omega)}{P_n^t(\omega)}. \quad \text{[Equation 9]}$$

A priori SNR is estimated as follows:

$$S\hat{N}R_{prio}^t(\omega)=(1-\beta)\cdot P[S\hat{N}R_{post}^t(\omega)-1]+\beta\cdot\{G^2[S\hat{N}R_{prio}^{t-1}(\omega),S\hat{N}R_{post}^{t-1}(\omega)]\cdot S\hat{N}R_{post}^{t-1}(\omega)\} \quad \text{[Equation 10]}.$$

A posteriori SNR is obtained from the input signal, while the a priori SNR is shaped from the a posteriori SNR with a smoothing factor β. The P[.] is defined as a half-wave rectification, and G(•) is the gain function. The new Wiener filter transfer function is same as Equation 8 with $\text{SÑR}_{prio}$ (ω) substituting the SNR variable in Equation 7.

The DD approach Wiener filter allows a fast tracking of increasing levels of speech power, thus leading efficiently to an adaptive smoothing. Consequently, less speech distortion is produced.

However, the Wiener filter is linear predictor, which only performs well under stationary background noise. Thus, even with a guaranteed performance, the Wiener filter system still requires a noise detection technique to accommodate for real-time noise.

B. Noise Detection

As previously described, the Wiener filter algorithm is based on an assumption that an estimate of the noise spectrum is available. In order to build an adaptive real-time filter, the update of reference noise is also required. For this reason, a noise-estimation technique is needed to achieve proper performance results in a speech-enhancement system.

Among several different noise detection techniques, there are two approaches to achieve this goal: voice activity detector (VAD) and noise estimator algorithms VAD algorithms include a group of signal processing methods that detect the absence or presence of human voice in short segments of speech signal. The output of a VAD algorithm is either '1' or '0' to indicate whether the segment contains voice activity or not. On the other hand, a noise estimator algorithm, such as a first-in, first-out (FIFO) register, can estimate the real-time noise by continuously tracking the noise spectrum. As such, the output of noise estimator algorithms is noise or noise spectrum only, as described in further detail below.

1. Voice Activity Detection (VAD)

VAD algorithms are typically designed to extract a particular feature from an audio signal, which is divided into short frames. These extracted features are compared with a threshold which can be estimated from a noise-only segment of the input signal. The decision of whether the feature contains speech can then be made based on the comparison.

Different VAD algorithms extract different features. Popular features include short-term energy, zero-crossing rate, and linear prediction coefficients. Because energy is the most basic feature of a signal, energy-based VAD methods are typically simple and reliable, and can be readily implemented in hardware under frequency domain.

2. Log-Energy VAD

Energy-based VAD algorithms assume that a speech signal has higher energy than noise. When the signals come in as segments, the log-energy, Es, is defined as follows:

$$E_s = 10 * \log_{10}\left(\varepsilon + \frac{1}{N}\sum_{n=1}^{N} y^2(n)\right),$$ [Equation 11]

where ε is a small positive constant added to prevent the computing of log zero. The value ε may be, for example, $10^{-5}$, which is small enough to be negligible, and prevents the system from calculating log(0). Here, high-energy frames are considered speech frames, and low-energy frames are considered non-speech frames.

In speech enhancement systems, the VAD part has two inputs: the current signal segment and reference noise. The respective energies of the two inputs are compared with each other to determine whether or not the current segment contains speech. If the comparison indicates that the segment contains speech, the signal segment will be filtered. If, on the other hand, the comparison indicates that the segment does not contain speech, the new noise frame will update the original reference noise.

It has been noted, however, that VAD algorithms cannot perform well under all conditions. For instance, performance of VAD algorithms is severely degraded amid weak speech components or strong background noise. Therefore, other approaches are preferable under such conditions.

C. Noise Estimator Algorithms

The main difference between noise estimator algorithms and VAD is that the noise estimator algorithms track the real-time noisy signal to estimate the "current" noise. The noise estimator algorithms are also an important part of speech enhancement systems, especially under non-stationary noise environments. Real world noise, however, will not always be stationary. For example, in a vehicular environment, the noise varies according to varying vehicular speeds, road conditions, weather conditions, etc. VAD cannot detect the changing noise during a speech segment. Additionally, the stop-closures of speech are not the only silent segments in speech. For instance, other instances of silence may include segments during unvoiced fricatives at low frequencies (e.g., car noise), and certain vowels during vocal sounds at high frequencies.

1. First-In, First-Out (FIFO) Register

The FIFO register is a noise estimator algorithm (generally called minimum statistics noise estimation) based on the assumption that the power of the noisy speech signal in individual frequency bands often decays to the power level of the noise. Tracking the minimum power of the noisy speech in each frequency band can produce a rough estimate of the noise level. Every signal frame is stored in a FIFO register. By tracking a sufficiently large number of consecutive frames, the smallest value of PSD conforms to the noise part of a noisy signal.

For each frequency band $\Omega_i$, the smallest value of PSD is $\hat{R}(n,\Omega_i)$. Since the PSD estimate of the noisy signal for the first frame has been calculated, the subsequent PSD estimates can be calculated using Equation 12, shown below. Consequently, by tracking a large number of frames, an estimate of the noise magnitude can be obtained as follows:

$$\hat{R}(n,\Omega_i)=\alpha_N\hat{R}(n-1,\Omega_i)+(1-\alpha_N)X^2(n,\Omega_i)$$ [Equation 12], where $\alpha_N$ is the smoothing factor. The higher the smoothing factor is, the more stable and smooth the estimate will be (with a maximum threshold after which it is no longer useful).

The minimum noise power estimate $N_{min}^2(n,\Omega_i)$ of subband $\Omega_i$ is obtained by frame-wise comparison of the actual smoothed signal power estimate $\hat{R}(n,\Omega_i)$. The values of PSDs are stored in a FIFO register whose depth is a given value R. To compensate for an overestimation of the results, an overestimation factor $B_{overest}$ needs to be added before the final output as follows:

$$N_{est}^2(n,\Omega_i)=B_{overest}*N_{min}^2(n,\Omega_i)$$ [Equation 13].

II. Log-Energy VAD and FIFO Algorithm Comparison

Pursuant to the understanding that vehicle noise increases with speed, it can be assumed that noises during high speed and low speed conditions contain the same components with the only difference being the noise power levels. Thus, a noise sample under 40 miles per hour (mph) was used to mimic noises from low to high speed, by multiplying different factors by the noise sample. Using this method, noise with different levels of power can be achieved as shown below:

$$\begin{bmatrix} n_1(n) \\ n_2(n) \\ \vdots \\ n_{m-1}(n) \\ n_m(n) \end{bmatrix} = \begin{bmatrix} a \\ 2a \\ \vdots \\ (m-1)a \\ ma \end{bmatrix} \cdot n(N).$$  [Equation 14]

The noisy signals can then be produced as follows:

$$y_m(n) = n_m(n) + s(n)$$  [Equation 15].

Since the noise and clean speech signals are known separately, a tracking of SNR value can be calculated as follows:

$$SNR = \frac{P_s(\omega)}{P_{n_m}(\omega)}.$$  [Equation 16]

The SNR value can be used as a reference for each test. Inputting the noisy signal produced from Equation 12, a performance comparison of the two speech enhancement systems under different noise conditions can be produced. To accurately compare the performance of the two different methods, the input signal of the two systems should be exactly the same. After filtering the signals with different SNR conditions, the outputs can be compared with the clean speech signal to evaluate the systems' performances.

Figure 1B:
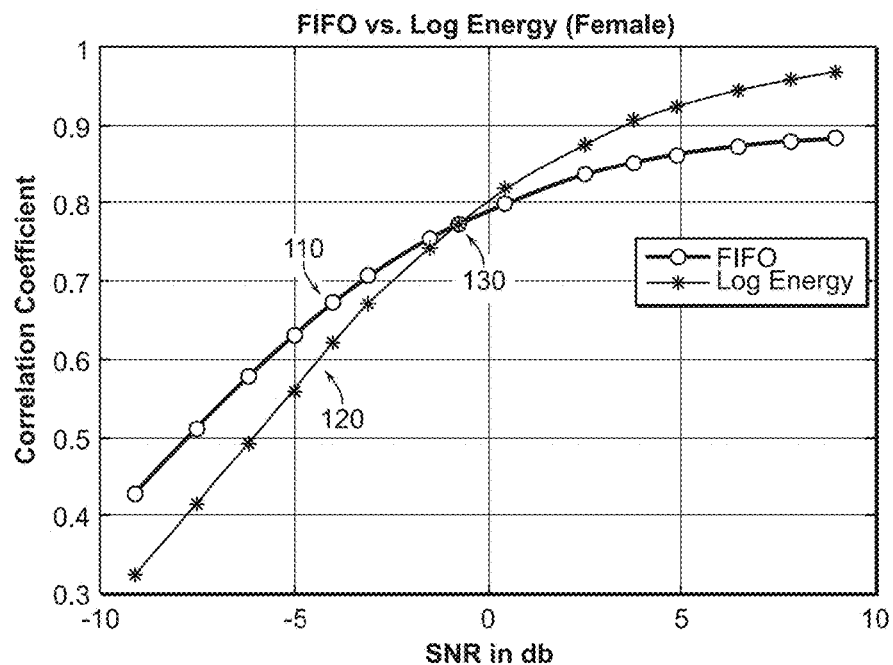

Quantitative analysis results are shown in FIGS. 1A and 1B, which include graphs illustrating a performance comparison of the FIFO signal processing technique 110 and log-energy VAD signal processing techniques 120 with different speech types. As shown in FIGS. 1A and 1B, the y-axis is the correlation coefficient, which is a statistical measure of the extent to which variations in one signal are related to variations in another signal. More specifically, the correlation coefficient describes how "close" the output signal is to that of the original clean speech signal. When correlation coefficient is equal to '1', the output signal is exactly the same as the original speech signal. As the correlation coefficient decreases, fewer similarities exist between the filtered output signal and the clean speech signal. The x-axis is SNR in dB. A low SNR typically signifies a high amount of noise, while a high SNR typically signifies lower background noise.

The analysis demonstrated in FIGS. 1A and 1B was conducted for both male and female speech, respectively. The dashed lines with open circles denote the FIFO noise estimation method 110, and the dashed lines with closed circles denote log-energy VAD 120. As shown in FIGS. 1A and 1B, the log-energy VAD 120 performed better under high SNR (i.e., low noise), while the FIFO noise estimation algorithm 110 performed better under low SNR conditions (i.e., high noise). When the background noise is low, the log-energy VAD 120 produces a clear output signal, and any remaining noise is hardly noticed. However, with an increase of noise level, the output of the log-energy VAD 120 can be affected significantly. For example, the output speech signal may occasionally contain "clipped voice" segments. The performance line of FIFO noise estimation algorithm 110, on the other hand, consistently shows a lesser slope value than that of the log-energy VAD 120. In a low SNR environment, the influence of noise on the FIFO noise estimation algorithm 110 is less than that on the log-energy VAD 120.

Notably, a critical point 130 where the FIFO algorithm 110 line and log-energy VAD 120 line intersect always exists under given noise conditions. The critical point 130, also referred to herein as the "SNR threshold," represents a SNR value at which the correlation coefficients of the FIFO signal processing technique 110 and the log-energy VAD signal processing technique 120, respectively, are the same. (Methods for calculating the correlation coefficient are described below.) The SNR threshold 130 can vary according to noise conditions in an environment in which the audio signal was acquired. The noise conditions may change based on environmental factors, such as a vehicle speed, a fan speed, a weather condition, whether a vehicle window is open, revolutions per minute (RPM) of an engine, a volume of media being played, and the like.

The SNR threshold 130 may be determined based on an estimated noise level of the environment in which the audio signal was acquired. As described in further detail below, the noise level in a vehicle (or other environment) may be estimated using the FIFO noise estimation algorithm 110. The noise level may also be estimated based on environmental conditions, such as a vehicle speed, a fan speed, a weather condition, whether a vehicle window is open, revolutions per minute (RPM) of an engine, a volume of media being played (e.g., using the vehicle's built-in stereo system), and the like.

The SNR threshold 130 may also be determined by referencing a look-up table. The look-up table can be generated by measuring SNR thresholds across a plurality of noise levels or conditions, such as the environmental conditions listed above. The SNR threshold 130 may also be manually adjusted to bias the adaptive Wiener filtering system toward either the FIFO algorithm 110 or log-energy VAD algorithm 120.

Since typical vehicle noise is highly dynamic, due to the many changes that occur in response to the unexpected conditions inherent in such environments, SNR levels can change frequently and rapidly even within a single trip. Consequently, when the FIFO algorithm 110 or log-energy VAD algorithm 120 is employed in a conventional manner, each will eventually encounter SNR conditions in which the algorithm suffers. But, since a critical point 130 (i.e., SNR threshold) where the FIFO algorithm 110 line and log-energy VAD 120 line intersect always exists, log-energy VAD- and FIFO-based Wiener filters can be employed jointly and adaptively in order to utilize the strength of each algorithm, as described in greater detail below.

III. Adaptive Critical Point-Based Wiener Filter

Figure 2:
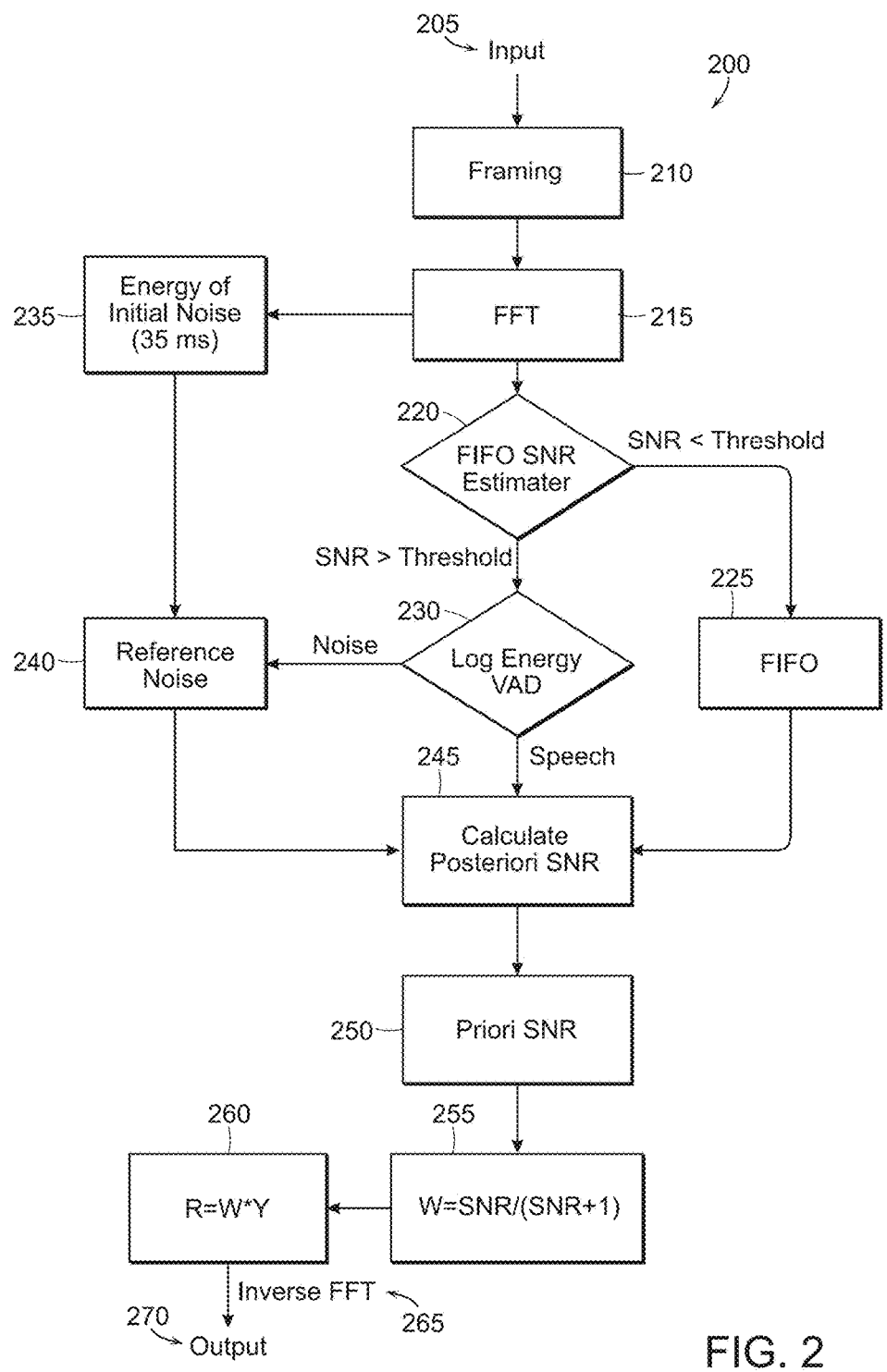
FIG. 2 is a flowchart illustrating an exemplary, simplified procedure for audio signal quality enhancement based on quantitative SNR analysis and adaptive Wiener filtering according to embodiments of the present disclosure.

FIG. 2 is a flowchart illustrating an exemplary, simplified procedure for audio signal quality enhancement based on quantitative SNR analysis and adaptive Wiener filtering according to embodiments of the present disclosure. The procedure 200 may start at step 205, and continue to step 210, where, as described in greater detail herein, an adaptive Wiener filter chooses between two different noise estimation methods based on varying noise conditions. Under high SNR, the system chooses log-energy VAD 120 for signal processing, and under low SNR, the system chooses FIFO noise estimation 110 for signal processing.

As described above, the Wiener filter is initiated by acquiring an audio signal y(n) as input (step 205). For instance, speech signals from a user (e.g., a driver or passenger) may be acquired in a vehicle using an audio acquisition device (not shown), such as a microphone or the like, installed in a vehicle. Of course, the speech signals may be corrupted by noise generated by sources inside of the vehicle (e.g., radio, HVAC fan, engine, turn signal indicator, window/sunroof adjustments, etc.) as well as outside of the vehicle (e.g., wind, rain, passing vehicles, road features such as pot holes, speed bumps, etc.).

The input signal can be framed into segments, resulting in $y_w(m)$ (step 210). Then, an audio frame (among the multiple audio frames resulting from the framing of the input signal) can be transformed into the frequency domain $Y_w(f)$, e.g., using a fast Fourier transform (FFT) (step 215).

Next, in order to determine whether to employ the FIFO algorithm 110 or log-energy VAD algorithm 120, noise present in audio frame can be estimated using the FIFO SNR estimator (step 220). To this end, the FIFO SNR estimator accepts the input signal $Y_w(f)$, and estimates the noise $N_{est}$, which is then used to obtain the estimated SNR, $SNR_{est}$, as shown in Equation 17 below:

$$SNR_{est} = \frac{Y_w(f)}{N_{est}}. \qquad \text{[Equation 17]}$$

The estimated SNR is then compared to the SNR threshold 130, i.e., the critical point at which the FIFO algorithm 110 line and log-energy VAD 120 line intersect, as shown in FIGS. 1A and 1B, to determine whether to process the audio frame using the FIFO algorithm 110 or log-energy VAD algorithm 120. As explained above, the SNR threshold 130 represents a SNR value at which the correlation coefficients of the FIFO signal processing technique 110 and the log-energy VAD signal processing technique 120, respectively, are the same.

The correlation coefficient of either algorithm can be calculated as follows:

$$r = \frac{\sum_m \sum_n (A_{mn} - \overline{A})(B_{mn} - \overline{B})}{\sqrt{\left(\sum_m \sum_n (A_{mn} - \overline{A})^2\right)\left(\sum_m \sum_n (B_{mn} - \overline{B})^2\right)}}, \qquad \text{[Equation 18]}$$

where $\overline{A}$=mean2(A) and $\overline{B}$=mean2(B). (mean2(x) refers to MATLAB syntax which calculates the mean of all elements of x.) A is clean speech signal, and $A_{mn}$ represents the elements in matrix A which are signal values in time domain. B is the output signal of filters, and $B_{mn}$ represents the elements in matrix B which are the output signal values in time domain.

Equation 18 is used to compare similarities between the two matrices (i.e., speech signals), A and B. For the purposes of the present disclosure, A is the input speech signal, and B is the estimated signal to be compared to A. The subscript indices m and n in the above equation refer to the elements found in a two dimensional matrices (e.g., the pixel location in an image). However, in the case of speech signals, the matrices A and B are only one dimensional matrices, and thus it is not required to use both m and n.

If the estimated SNR, $SNR_{est}$, is less than the SNR threshold 130, the FIFO method 110 is chosen to perform the noise estimation (step 225). The Wiener filter then uses $N_{est}$ from the FIFO noise estimation in step 220 to calculate the a posteriori SNR (step 245) and a priori SNR (step 250), as described above.

On the other hand, if the $SNR_{est}$ is greater than the SNR threshold 130, the log-energy VAD method 120 is chosen to perform the noise detection (step 230). In this case, initial energy of the frame (e.g., the first 25 ms) will be considered as a noise-only signal (i.e., no speech), and is reserved as the noise reference for log-energy VAD (steps 235 and 240).

The processed signal is eventually transformed back to the time domain from the frequency domain. In this regard, the Wiener filter's transfer function can be performed, as described above (see Equation 8) (step 255). Then, the signal can be outputted in the frequency domain as follows:

$$R = W*Y \qquad \text{[Equation 19]},$$

where R is the output signal in the frequency domain, W is the transfer function in step 255, and Y is the input to the Wiener filter (step 260).

Finally, the output signal is transitioned back to the time domain (e.g., using an inverse FFT) (step 265). The filtered signal is then outputted (step 270), after being processed using either the log-energy VAD-based Wiener filter or the FIFO-based Wiener filter, depending on the estimated SNR and the SNR threshold 130.

The procedure 200 illustratively ends at step 270. The techniques by which the steps of procedure 200 may be performed, as well as ancillary procedures and parameters, are described in detail above. In addition, each audio frame of the acquired audio signal will have an output which comes from either the log-energy VAD-based Wiener filter or the FIFO-based Wiener filter. Therefore, it should be understood the steps shown in FIG. 2 may be repeated for each of the multiple audio frames.

It also should be noted that the steps shown in FIG. 2 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Even further, the illustrated steps may be modified in any suitable manner in accordance with the scope of the present claims.

IV. Performance Results

Figures 3A, 3B, 3C, 3D:
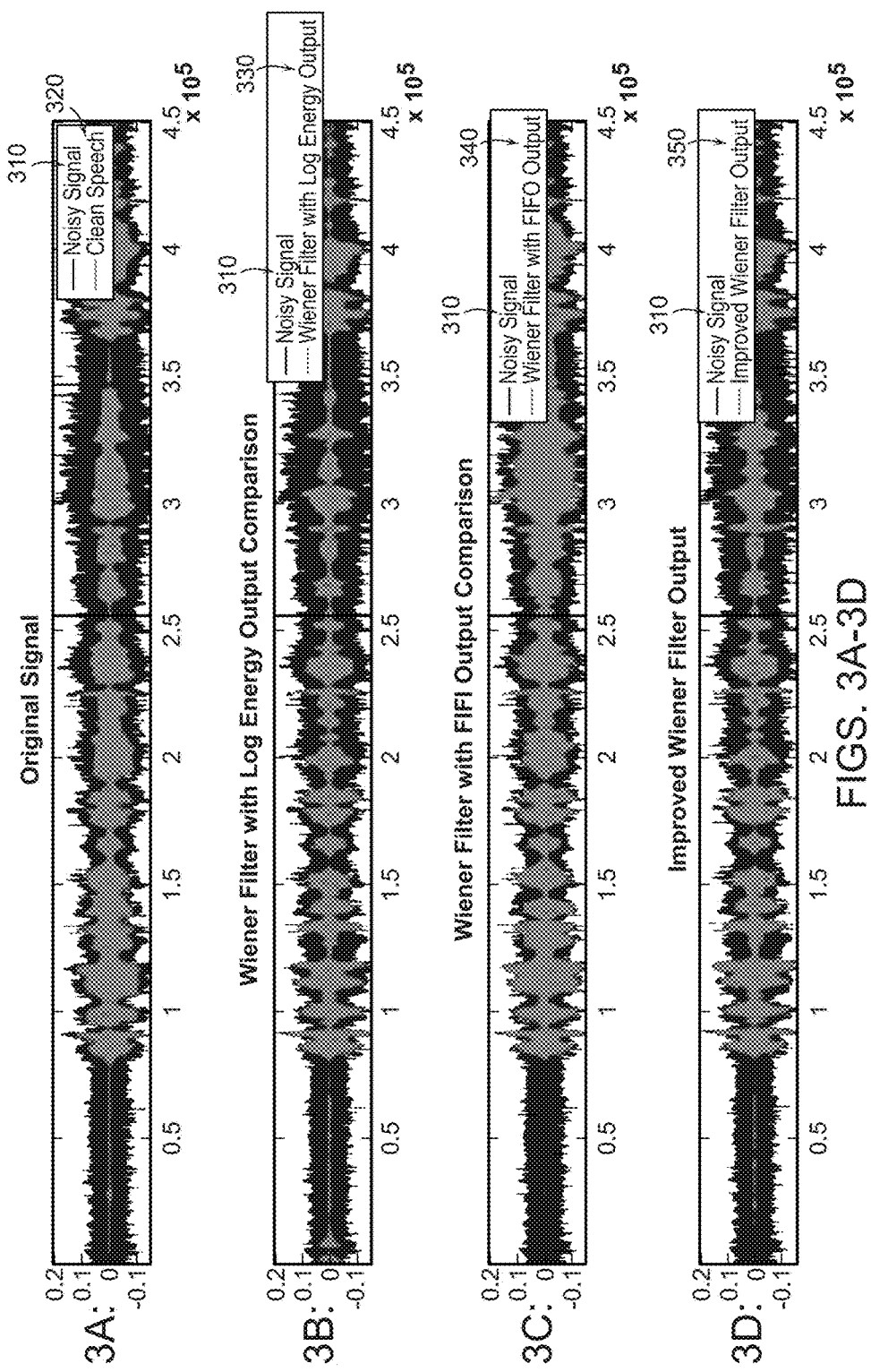
FIGS. 3A-3D include simulation results comparing signal output of conventional Wiener filtering to signal output of adaptive Wiener filtering based on quantitative SNR analysis according to embodiments of the present disclosure.

FIGS. 3A-3D include simulation results comparing signal output of conventional Wiener filtering to signal output of adaptive Wiener filtering based on quantitative SNR analysis according to embodiments of the present disclosure. FIG. 3A compares the clean speech signal 320 with that of the noisy signal 310; FIG. 3B compares the Wiener filter with a log-energy VAD output signal 330 with that of the noisy signal 310; FIG. 3C compares the Wiener filter with a FIFO output signal 340 with that of the noisy signal 310; and FIG. 3D compares an output signal of the adaptive Wiener filter 350, according to embodiments of the present disclosure, with that of the noisy signal 310. It can be seen in FIGS. 3B and 3C that the log-energy VAD generally works well, but speech signal is chopped in some speech frames, which does not occur with the FIFO system at those same speech frames. It can also be seen in FIG. 3D that the adaptive Wiener filter performs well throughout the entire frame.

FIG. 3A shows a clear discrepancy between the noisy signal 310 and clean speech signal 320. In other words, noise has considerably distorted the original signal. Using the $3.0 \times 10^5$ seconds and $3.5 \times 10^5$ seconds time slots as an example, the "Wiener Filter with Log Energy" (FIG. 3B) changes the clean speech structure by reducing both noise and speech amplitudes, causing speech to sound "chopped."

Meanwhile, the "Wiener Filter with FIFO" (FIG. 3C) distorts the signal by over-amplifying it, causing speech to sound robotic.

Although the Wiener filter, with both log-energy VAD and FIFO, provided some improvements relative to that of the noisy signal 310, the aforementioned noticeable drawbacks provided by these filters justify the need to propose the adaptive filtering algorithm based on quantitative SNR analysis described herein. The adaptive Wiener filter 350, according to embodiments of the present disclosure, shown in FIG. 3D produces an output signal 350 which is the closest replica of the original speech signal 320 shown in FIG. 3A. As a result, the listener may clearly notice a considerable audio improvement provided by the adaptive Wiener filtering algorithm based on quantitative SNR analysis described herein not present in the two methods shown in FIGS. 3B and 3C.

Accordingly, techniques are described herein that can be used to improve audio quality in vehicular Bluetooth applications, as well as any applications with desired speech enhancements, such as speech recognition applications in vehicles, which contributes to safer driving. The modified Wiener filtering algorithm described hereinabove utilizes an optimized, adaptive approach to noise reduction that combines log-energy VAD and FIFO noise estimation techniques with Wiener filtering to enhance audio signal quality in a varying noise environment. Both noise estimation techniques have advantages under different noisy conditions, described in detail above. Combining the log-energy VAD and FIFO noise estimation techniques in a strategic manner, which leverages each algorithm's strengths while mitigating each algorithm's weaknesses, improves Wiener filtering performance, allowing for greater sensitivity and accuracy in speech recognition. The result is a new signal filtering algorithm which improves upon conventional Wiener filtering.

While there have been shown and described illustrative embodiments that provide adaptive Wiener filtering based on quantitative SNR analysis for vehicular audio signal enhancement, it is to be understood that various other adaptations and modifications may be made within the spirit and scope of the embodiments herein. For instance, the techniques described herein can be integrated into noise cancellation algorithms in Bluetooth modules and hands-free application in vehicles. Also, the described techniques can be implemented in transmitters in vehicles to filter out noises that are generated in the cabins; in this way, corresponding receivers can receive enhanced audio quality. Further, the adaptive Wiener filtering techniques described herein may be combined with other filtering techniques such as spectral subtraction, Kalman filtering, and so forth. Therefore, the embodiments of the present disclosure may be modified in a suitable manner in accordance with the scope of the present claims.

The foregoing description has been directed to embodiments of the present disclosure. It will be apparent, however, that other variations and modifications may be made to the described embodiments, with the attainment of some or all of their advantages. Accordingly, this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An audio signal enhancement method comprising:
   acquiring an audio signal;
   estimating a signal-to-noise ratio (SNR) of an audio frame of the audio signal;
   determining a SNR threshold for the audio frame;
   comparing the SNR threshold to the estimated SNR of the audio frame;
   selecting a first-in, first-out (FIFO) signal processing technique for noise estimation when the estimated SNR of the audio frame is less than the SNR threshold;
   selecting a log-energy voice activity detection (VAD) signal processing technique for noise estimation when the estimated SNR of the audio frame is greater than the SNR threshold;
   filtering the audio frame using a Wiener filter applying the selected signal processing technique; and
   outputting the audio frame filtered using the Wiener filter applying the selected signal processing technique, wherein
   the determination of the SNR threshold comprises calculating correlation coefficients of the FIFO signal processing technique and the log-energy VAD signal processing technique, respectively,
   the respective correlation coefficients of the FIFO signal processing technique and the log-energy VAD signal processing technique measure a correlation between a clean signal and respective output signals of the FIFO signal processing technique and the log-energy VAD signal processing technique, and
   the SNR threshold is a SNR value at which the respective correlation coefficients of the FIFO signal processing technique and the log-energy VAD signal processing technique are the same.

2. The audio signal enhancement method of claim 1, wherein the determining of the SNR threshold comprises:
   estimating a noise level in an environment in which the audio signal was acquired; and
   determining the SNR threshold based on the estimated noise level.

3. The audio signal enhancement method of claim 2, wherein estimating of the noise level comprises:
   determining one or more environmental conditions present when the audio signal is acquired; and
   estimating the noise level based on the one or more environmental conditions.

4. The audio signal enhancement method of claim 3, wherein the one or more environmental conditions include one or more of a vehicle speed, a fan speed, a weather condition, whether a vehicle window is open, revolutions per minute (RPM) of an engine, and a volume of media being played.

5. The audio signal enhancement method of claim 2, wherein estimating of the noise level comprises:
   estimating the noise level using the FIFO signal processing technique.

6. The audio signal enhancement method of claim 2, further comprising:
   referencing a look-up table to determine the SNR threshold based on the estimated noise level.

7. The audio signal enhancement method of claim 6, further comprising:
   measuring SNR thresholds across a plurality of noise conditions; and
   generating the look-up table using the measured SNR thresholds across the plurality of noise levels.

8. The audio signal enhancement method of claim 1, wherein the SNR threshold varies according to noise conditions in an environment in which the audio signal was acquired.

9. The audio signal enhancement method of claim 1, wherein the estimating of the SNR comprises:
estimating the SNR of the audio frame using the FIFO signal processing technique.

10. The audio signal enhancement method of claim 1, further comprising:
dividing the acquired audio signal into a plurality of audio frames,
wherein the audio frame is one of the plurality of audio frames.

11. The audio signal enhancement method of claim 10, wherein the steps of estimating the SNR, determining the SNR threshold, selecting the audio signal processing technique, filtering the audio frame using the Wiener filter applying the selected signal processing technique, and outputting the audio frame using the Wiener filter applying the selected signal processing technique are performed for each of the plurality of audio frames.

12. The audio signal enhancement method of claim 1, wherein the acquired audio signal includes a combination of noise and speech.

13. The audio signal enhancement method of claim 1, wherein the outputted filtered audio frame includes speech from which noise present in the audio frame is removed.

14. The audio signal enhancement method of claim 1, further comprising:
converting the audio frame into a frequency domain using a fast Fourier transform (FFT) before the filtering of the audio frame.

15. The audio signal enhancement method of claim 1, wherein the audio signal is acquired via Bluetooth.

16. The audio signal enhancement method of claim 1, wherein the audio signal is acquired in a vehicle.

17. An audio signal enhancement apparatus comprising:
an audio acquisition device acquiring an audio signal in a vehicle; and
a control unit equipped in the vehicle configured to:
estimate a signal-to-noise ratio (SNR) of an audio frame of the audio signal;
determine a SNR threshold for the audio frame;
compare the SNR threshold to the estimated SNR of the audio frame;
select a first-in, first-out (FIFO) signal processing technique for noise estimation when the estimated SNR of the audio frame is less than the SNR threshold;
select a log-energy voice activity detection (VAD) signal processing technique for noise estimation when the estimated SNR of the audio frame is greater than the SNR threshold;
filter the audio frame using a Wiener filter applying the selected signal processing technique; and
output the audio frame filtered using the Wiener filter applying the selected signal processing technique, wherein
the determination of the SNR threshold comprises calculating correlation coefficients of the FIFO signal processing technique and the log-energy VAD signal processing technique, respectively,
the respective correlation coefficients of the FIFO signal processing technique and the log-energy VAD signal processing technique measure a correlation between a clean signal and respective output signals of the FIFO signal processing technique and the log-energy VAD signal processing technique, and
the SNR threshold is a SNR value at which the respective correlation coefficients of the FIFO signal processing technique and the log-energy VAD signal processing technique are the same.

18. A non-transitory computer readable medium containing program instructions for performing an audio signal enhancement method, the computer readable medium comprising:
program instructions that estimate a signal-to-noise ratio (SNR) of an audio frame of an acquired audio signal;
program instructions that determine a SNR threshold for the audio frame;
program instructions that compare the SNR threshold to the estimated SNR of the audio frame;
program instructions that select a first-in, first-out (FIFO) signal processing technique for noise estimation when the estimated SNR of the audio frame is less than the SNR threshold;
program instructions that select a log-energy voice activity detection (VAD) signal processing technique for noise estimation when the estimated SNR of the audio frame is greater than the SNR threshold;
program instructions that filter the audio frame using a Wiener filter applying the selected signal processing technique; and
program instructions that output the audio frame filtered using the Wiener filter applying the selected signal processing technique, wherein
the determination of the SNR threshold comprises calculating correlation coefficients of the FIFO signal processing technique and the log-energy VAD signal processing technique, respectively,
the respective correlation coefficients of the FIFO signal processing technique and the log-energy VAD signal processing technique measure a correlation between a clean signal and respective output signals of the FIFO signal processing technique and the log-energy VAD signal processing technique, and
the SNR threshold is a SNR value at which the respective correlation coefficients of the FIFO signal processing technique and the log-energy VAD signal processing technique are the same.

* * * * *